(12) United States Patent
Chang et al.

(10) Patent No.: US 10,899,247 B2
(45) Date of Patent: Jan. 26, 2021

(54) SYSTEM AND METHOD FOR ONLINE VEHICLE BATTERY CAPACITY DIAGNOSIS

(71) Applicant: FORD GLOBAL TECHNOLOGIES, LLC, Dearborn, MI (US)

(72) Inventors: Xiaoguang Chang, Northville, MI (US); Xu Wang, Northville, MI (US); Chuan He, Northville, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 796 days.

(21) Appl. No.: 15/176,272

(22) Filed: Jun. 8, 2016

(65) Prior Publication Data

US 2017/0355276 A1    Dec. 14, 2017

(51) Int. Cl.
| | | |
|---|---|---|
| *B60L 58/12* | (2019.01) | |
| *G01R 31/3842* | (2019.01) | |
| *B60L 11/18* | (2006.01) | |
| *G01R 31/36* | (2020.01) | |

(52) U.S. Cl.
CPC .......... *B60L 58/12* (2019.02); *B60L 11/1861* (2013.01); *G01R 31/3648* (2013.01); *G01R 31/3842* (2019.01)

(58) Field of Classification Search
CPC .............................. B60L 11/1861; B60L 58/12
USPC ........................................................ 320/109
See application file for complete search history.

(56) References Cited

U.S. PATENT DOCUMENTS

| | | | | |
|---|---|---|---|---|
| 6,850,038 B2* | 2/2005 | Arai | ...................... | H01M 10/48 320/132 |
| 7,649,338 B2* | 1/2010 | Seo | ........................ | B60W 10/26 320/132 |
| 7,679,329 B2* | 3/2010 | Lim | .................... | B60L 11/1887 320/132 |
| 7,775,310 B2* | 8/2010 | Andri | ....................... | B60K 6/48 180/65.28 |
| 8,004,243 B2* | 8/2011 | Paryani | .............. | G01R 31/3624 320/132 |
| 8,629,657 B2* | 1/2014 | Kishiyama | .......... | B60L 11/1824 320/102 |
| 8,712,619 B2* | 4/2014 | Kusumi | ................... | B60K 6/46 180/2.2 |
| 8,798,833 B2* | 8/2014 | Kusumi | ................... | B60K 6/46 701/22 |
| 8,820,446 B2* | 9/2014 | Kusumi | ................... | B60K 6/46 180/65.27 |
| 9,187,007 B2 | 11/2015 | Li et al. | | |
| 9,469,292 B2* | 10/2016 | Hisano | ................ | B60W 50/085 |
| 9,561,790 B2* | 2/2017 | Kanehara | ............... | B60K 6/442 |
| 2013/0062941 A1* | 3/2013 | Yamamoto | ............. | B60K 6/445 307/10.6 |
| 2014/0244193 A1 | 8/2014 | Balasingam et al. | | |

(Continued)

*Primary Examiner* — Jerry D Robbins
(74) *Attorney, Agent, or Firm* — David B Kelley; Brooks Kushman PC

(57) ABSTRACT

A vehicle includes a traction battery. The vehicle further includes a controller programmed to generate a capacity estimate of the traction battery and, in response to an amount of energy supplied to the traction battery during a charge cycle being less than an estimated amount of energy stored in the traction battery during the charge cycle, detect that the capacity of the traction battery has changed and alter an operating strategy of the traction battery until the capacity estimate is updated.

20 Claims, 4 Drawing Sheets

(56) References Cited

U.S. PATENT DOCUMENTS

| | | | |
|---|---|---|---|
| 2015/0115715 A1* | 4/2015 | Chung | H02J 3/28 307/23 |
| 2016/0013676 A1* | 1/2016 | Kaji | H02J 3/32 320/134 |
| 2017/0054316 A1* | 2/2017 | Francis-Buller | H02J 7/0057 |

* cited by examiner

SYSTEM AND METHOD FOR ONLINE VEHICLE BATTERY CAPACITY DIAGNOSIS

TECHNICAL FIELD

This application generally relates to a system for estimating battery capacity for a vehicle traction battery.

BACKGROUND

Hybrid and electric vehicles include a high-voltage traction battery to provide stored electrical energy for propulsion and other vehicle functions. Performance of the traction battery may change over time. For example, the maximum amount of energy that may be stored by the traction battery generally decreases over time.

SUMMARY

A vehicle power system includes a controller programmed to operate a traction battery within a first state of charge range and, in response to an amount of energy supplied to the traction battery during a charge cycle being less than an estimated amount of energy stored in the traction battery during the charge cycle, operate the traction battery within a second state of charge range that is narrower than the first state of charge range.

A vehicle includes a traction battery and a controller programmed to operate the traction battery within a state of charge operating range defined by an upper limit and a lower limit and, in response to an amount of energy supplied to the traction battery during a charge cycle being less than an estimated amount of energy stored in the traction battery during the charge cycle, reduce the upper limit.

A vehicle includes a traction battery and a controller programmed to operate the traction battery within a state of charge operating range defined by an upper limit and a lower limit and, in response to an amount of energy supplied to the traction battery during a charge cycle being less than an estimated amount of energy stored in the traction battery during the charge cycle, reduce the upper limit.

DETAILED DESCRIPTION

Embodiments of the present disclosure are described herein. It is to be understood, however, that the disclosed embodiments are merely examples and other embodiments can take various and alternative forms. The figures are not necessarily to scale; some features could be exaggerated or minimized to show details of particular components. Therefore, specific structural and functional details disclosed herein are not to be interpreted as limiting, but merely as a representative basis for teaching one skilled in the art to variously employ the present invention. As those of ordinary skill in the art will understand, various features illustrated and described with reference to any one of the figures can be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

Figure 1:
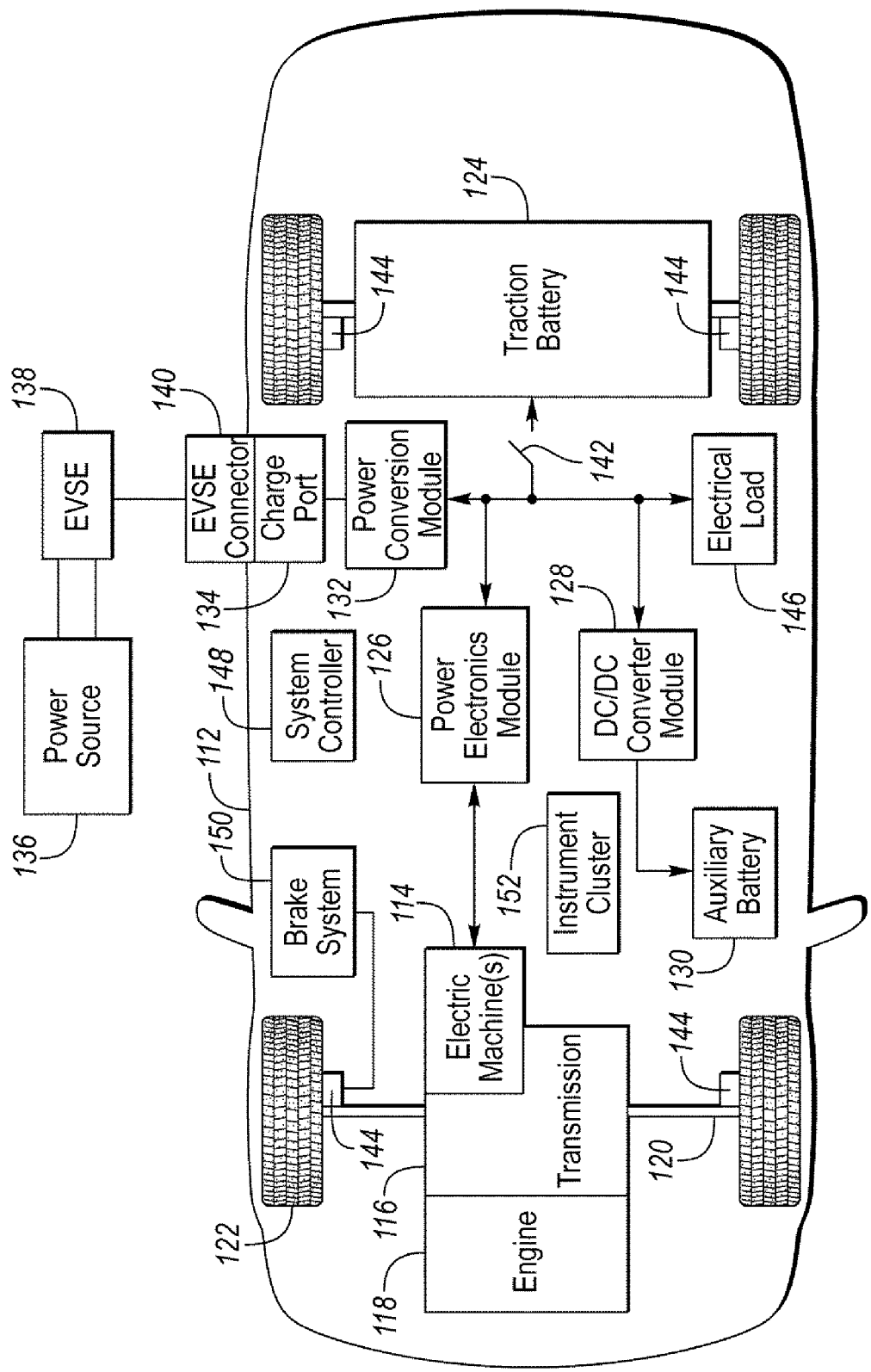
FIG. 1 is a diagram of a hybrid vehicle illustrating typical drivetrain and energy storage components.

FIG. 1 depicts a typical plug-in hybrid-electric vehicle (PHEV). A typical plug-in hybrid-electric vehicle 112 may comprise one or more electric machines 114 mechanically coupled to a hybrid transmission 116. The electric machines 114 may be capable of operating as a motor or a generator. In addition, the hybrid transmission 116 is mechanically coupled to an engine 118. The hybrid transmission 116 is also mechanically coupled to a drive shaft 120 that is mechanically coupled to the wheels 122. The electric machines 114 can provide propulsion and deceleration capability when the engine 118 is turned on or off. The electric machines 114 also act as generators and can provide fuel economy benefits by recovering energy that would normally be lost as heat in a friction braking system. The electric machines 114 may also reduce vehicle emissions by allowing the engine 118 to operate at more efficient speeds and allowing the hybrid-electric vehicle 112 to be operated in electric mode with the engine 118 off under certain conditions.

A traction battery or battery pack 124 stores energy that can be used by the electric machines 114. A vehicle battery pack 124 typically provides a high voltage direct current (DC) output. The traction battery 124 may be electrically coupled to one or more power electronics modules. One or more contactors 142 may isolate the traction battery 124 from other components when opened and connect the traction battery 124 to other components when closed. The power electronics module 126 may also be electrically coupled to the electric machines 114 and provides the ability to bi-directionally transfer energy between the traction battery 124 and the electric machines 114. For example, a traction battery 124 may provide a DC voltage while the electric machines 114 may operate with a three-phase alternating current (AC) to function. The power electronics module 126 may convert the DC voltage to a three-phase AC current to operate the electric machines 114. In a regenerative mode, the power electronics module 126 may convert the three-phase AC current from the electric machines 114 acting as generators to the DC voltage compatible with the traction battery 124. The description herein is equally applicable to a pure electric vehicle. For a pure electric vehicle, the hybrid transmission 116 may be a gear box connected to an electric machine 114 and the engine 118 may not be present.

In addition to providing energy for propulsion, the traction battery 124 may provide energy for other vehicle electrical systems. A vehicle 112 may include a DC/DC converter module 128 that converts the high voltage DC output of the traction battery 124 to a low voltage DC supply that is compatible with low-voltage vehicle loads. An output of the DC/DC converter module 128 may be electrically coupled to an auxiliary battery 130 (e.g., 12V battery). The low-voltage systems may be electrically coupled to the auxiliary battery. Other high-voltage loads 146, such as compressors and electric heaters, may be coupled to the high-voltage output of the traction battery 124. The electrical loads 146 may have an associated controller that operates and controls the electrical loads 146 when appropriate.

The vehicle 112 may be an electric vehicle or a plug-in hybrid vehicle in which the traction battery 124 may be recharged by an external power source 136. The external power source 136 may be a connection to an electrical outlet. The external power source 136 may be electrically coupled to a charger or electric vehicle supply equipment (EVSE) 138. The external power source 136 may be an electrical power distribution network or grid as provided by an electric utility company. The EVSE 138 may provide circuitry and controls to regulate and manage the transfer of energy between the power source 136 and the vehicle 112. The external power source 136 may provide DC or AC electric power to the EVSE 138. The EVSE 138 may have a charge connector 140 for plugging into a charge port 134 of the vehicle 112. The charge port 134 may be any type of port configured to transfer power from the EVSE 138 to the vehicle 112. The charge port 134 may be electrically coupled to a charger or on-board power conversion module 132. The power conversion module 132 may condition the power supplied from the EVSE 138 to provide the proper voltage and current levels to the traction battery 124. The power conversion module 132 may interface with the EVSE 138 to coordinate the delivery of power to the vehicle 112. The EVSE connector 140 may have pins that mate with corresponding recesses of the charge port 134. Alternatively, various components described as being electrically coupled or connected may transfer power using a wireless inductive coupling.

One or more wheel brakes 144 may be provided for decelerating the vehicle 112 and preventing motion of the vehicle 112. The wheel brakes 144 may be hydraulically actuated, electrically actuated, or some combination thereof. The wheel brakes 144 may be a part of a brake system 150. The brake system 150 may include other components to operate the wheel brakes 144. For simplicity, the figure depicts a single connection between the brake system 150 and one of the wheel brakes 144. A connection between the brake system 150 and the other wheel brakes 144 is implied. The brake system connections may be hydraulic and/or electrical. The brake system 150 may include a controller to monitor and coordinate operation of the wheel brakes 144. The brake system 150 may monitor the brake components and control the wheel brakes 144 for vehicle deceleration. The brake system 150 may respond to driver commands and may also operate autonomously to implement features such as stability control. The controller of the brake system 150 may implement a method of applying a requested brake force when requested by another controller or sub-function.

Electronic modules in the vehicle 112 may communicate via one or more vehicle networks. The vehicle network may include a plurality of channels for communication. One channel of the vehicle network may be a serial bus such as a Controller Area Network (CAN). One of the channels of the vehicle network may include an Ethernet network defined by Institute of Electrical and Electronics Engineers (IEEE) 802 family of standards. Additional channels of the vehicle network may include discrete connections between modules and may include power signals from the auxiliary battery 130. Different signals may be transferred over different channels of the vehicle network. For example, video signals may be transferred over a high-speed channel (e.g., Ethernet) while control signals may be transferred over CAN or discrete signals. The vehicle network may include any hardware and software components that aid in transferring signals and data between modules. The vehicle network is not shown in FIG. 1 but it may be implied that the vehicle network may connect to any electronic module that is present in the vehicle 112. A vehicle system controller (VSC) 148 may be present to coordinate the operation of the various components.

Figure 2:
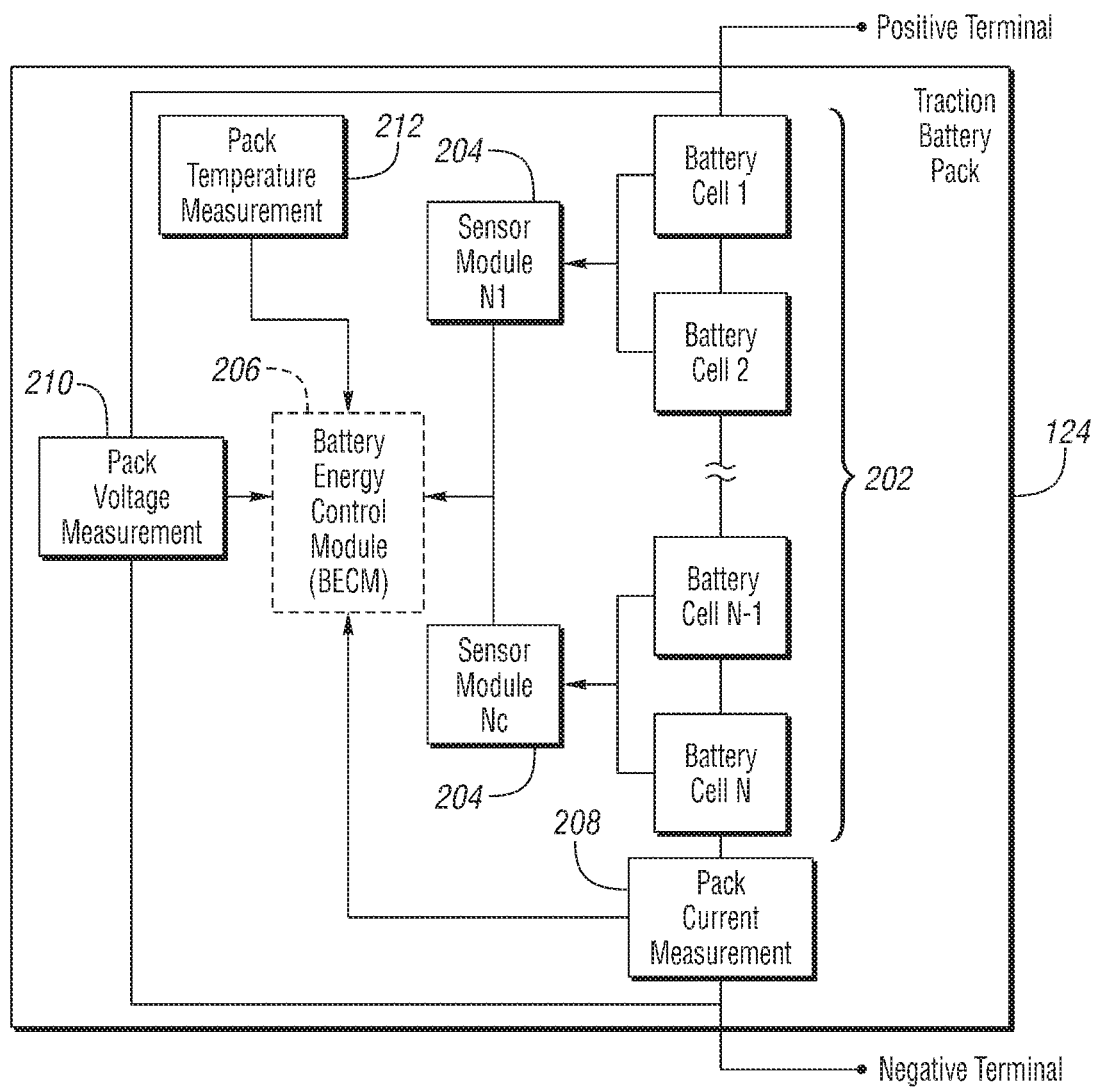
FIG. 2 is a diagram of a possible battery pack arrangement comprised of multiple cells, and monitored and controlled by a Battery Energy Control Module.

A traction battery 124 may be constructed from a variety of chemical formulations. Typical battery pack chemistries may be lead acid, nickel-metal hydride (NIMH) or Lithium-Ion. FIG. 2 shows a typical traction battery pack 124 in a simple series configuration of N battery cells 202. Other battery packs 124, however, may be composed of any number of individual battery cells connected in series or parallel or some combination thereof. A battery management system may have one or more controllers, such as a Battery Energy Control Module (BECM) 206, that monitor and control the performance of the traction battery 124. The battery pack 124 may include sensors to measure various pack level characteristics. The battery pack 124 may include one or more pack current measurement sensors 208, pack voltage measurement sensors 210, and pack temperature measurement sensors 212. The BECM 206 may include circuitry to interface with the pack current sensors 208, the pack voltage sensors 210 and the pack temperature sensors 212. The BECM 206 may have non-volatile memory such that data may be retained when the BECM 206 is in an off condition. Retained data may be available upon the next key cycle.

In addition to the pack level characteristics, there may be battery cell 202 level characteristics that are measured and monitored. For example, the terminal voltage, current, and temperature of each cell 202 may be measured. A system may use one or more sensor modules 204 to measure the battery cell 202 characteristics. Depending on the capabilities, the sensor modules 204 may measure the characteristics of one or multiple of the battery cells 202. The battery pack 124 may utilize up to N, sensor modules 204 to measure the characteristics of all the battery cells 202. Each of the sensor modules 204 may transfer the measurements to the BECM 206 for further processing and coordination. The sensor modules 204 may transfer signals in analog or digital form to the BECM 206. In some configurations, the functionality of the sensor modules 204 may be incorporated internally to the BECM 206. That is, the hardware of the sensor modules 204 may be integrated as part of the circuitry in the BECM 206 and the BECM 206 may handle the processing of raw signals. The BECM 206 may also include circuitry to interface with the one or more contactors 142 to open and close the contactors 142.

It may be useful to calculate various characteristics of the battery pack. Quantities such as battery power capability, battery capacity, and battery state of charge may be useful for controlling the operation of the traction battery 124 as well as any electrical loads receiving power from the traction battery 124. Battery power capability is a measure of the maximum amount of power the traction battery 124 can provide or the maximum amount of power that the traction battery 124 can receive. Knowing the battery power capability allows the electrical loads to be managed such that the power requested is within limits that the traction battery 124 can handle.

Battery capacity is a measure of a total amount of energy that may be stored in the traction battery 124. The battery capacity may be expressed in units of Amp-hours. Values related to the battery capacity may be referred to as amp-hour values. The battery capacity of the traction battery 124 may decrease over the life of the traction battery 124.

State of charge (SOC) gives an indication of how much charge remains in the traction battery 124. The SOC may be expressed as a percentage of the total charge relative to the battery capacity remaining in the traction battery 124. The SOC value may be output to inform the driver of how much charge remains in the traction battery 124, similar to a fuel gauge. The SOC may also be used to control the operation of an electric or hybrid-electric vehicle. Calculation of SOC can be accomplished by a variety of methods. One possible method of calculating SOC is to perform an integration of the traction battery current over time. This is well-known in the art as ampere-hour integration.

Figure 3:
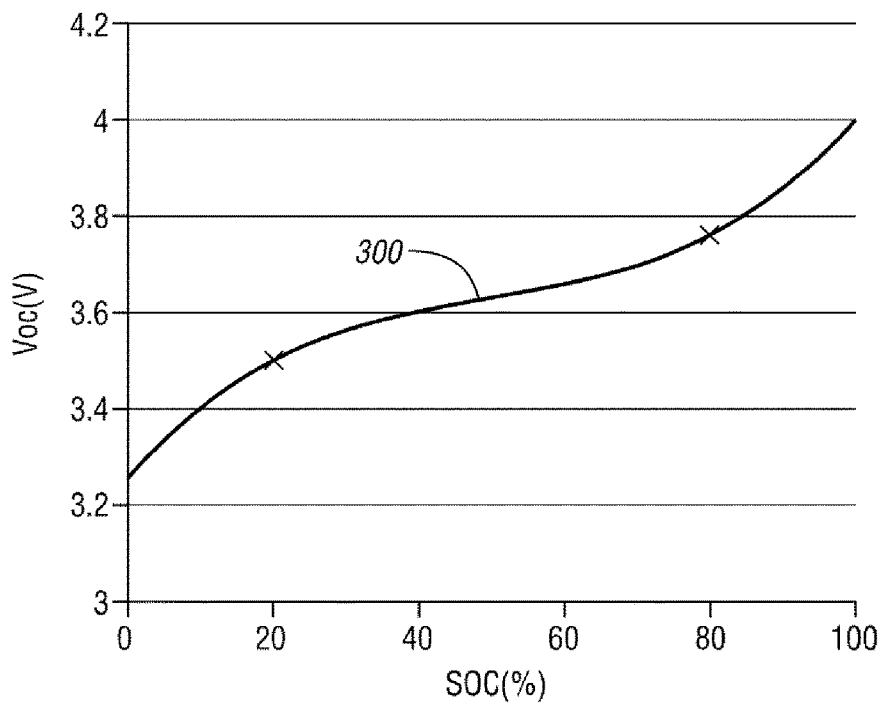
FIG. 3 is a graph depicting a possible relationship between battery open-circuit voltage and battery state of charge.

For a lithium-ion battery cell, an initial SOC value for a drive cycle may be estimated based on an open-circuit voltage (OCV) measurement before the battery cell is coupled to a load. After a rest period, a terminal voltage of the battery cell and the open-circuit voltage will be equivalent under no-load conditions. There exists a relationship between the SOC and the open-circuit voltage of the battery cell. A possible relationship is depicted in FIG. 3 as a characteristic curve 300 relating the SOC to the open-circuit voltage ($V_{oc}$ or OCV). The characteristic curve 300 may be acquired during battery cell testing and may be translated to a table for storage in non-volatile memory of the BECM 206. The initial SOC may be determined by measuring the terminal voltage of the battery cell and setting the initial SOC to the SOC value from the characteristic curve 300 corresponding to the measured voltage value.

The described components may be part of a vehicle power system that is configured to manage and control power to and from the traction battery 124. The vehicle power system may include a controller programmed to operate the traction battery 124 and manage the state of charge of the traction battery 124. The traction battery 124 may be charged or discharged according to a target state of charge compared to a present state of charge. For example, when the present state of charge is greater than the target state of charge, the traction battery 124 may be discharged. Operation of the traction battery 124 may be achieved by commanding a torque of the electric machines 114 to draw current from or provide current to the traction battery 124. Operation of the traction battery 124 may further involve commanding operation of the engine 118 to provide power to the electric machines 114 to charge the traction battery 124.

The capacity of the traction battery 124 may decrease with time and vehicle usage. This may be referred to as aging of the traction battery 124. The battery decay or aging is characterized as a decrease in battery capacity and charge/discharge power capability. The battery decay can affect performance and fuel economy of hybrid vehicles if the control strategies are not updated to account for battery aging. In order to properly control the vehicle 112, it is useful to know the capacity as the traction battery 124 ages.

Various self-learning algorithms are available for estimating battery capacity. The BECM 206 may be programmed to estimate the traction battery capacity during operation of the vehicle 112. The battery capacity learning strategy may be any algorithm or strategy known in the prior art. For example, battery charge capacity may be estimated as battery current throughput divided by a difference in state of charge (SOC) values. This approach is based on knowledge of two separate SOC values obtained independent of battery capacity. The battery capacity may be calculated as:

$$C_{bat} = \frac{\int_{Ti}^{Tf} i dt}{SOC_i - SOC_f} = \frac{Throughput}{SOC_i - SOC_f} \quad (1)$$

where $SOC_i$ and $SOC_f$ are the state of charge values at times $T_i$ and $T_f$ respectively and i is the current flowing to or from the battery. The battery current throughput may be defined as the integral of battery current over a time period. When implemented in a controller 206, the integral may be replaced by a summation of current values multiplied by the sample time.

The state of charge values, $SOC_i$ and $SOC_f$, may be based on measured voltages sampled over two key-on/key-off cycles. For a lithium-ion battery, it is well-known that after the battery has been resting a sufficient time, the terminal voltage is approximately equal to the open-circuit voltage of the battery (i.e., $V_t = V_{oc}$). The terminal voltage may be measured at system power-up and the state of charge may be derived from the open-circuit voltage. A relationship between state of charge and open-circuit voltage may be obtained via test data or manufacturer data (see FIG. 3). The throughput value may be accumulated during each ignition cycle and stored in a non-volatile memory for use in the next ignition cycle. Upon power-up in an immediately subsequent ignition cycle, the terminal voltage may be sampled and the battery capacity computed. Other methods of battery capacity may be equally applicable to the methods and systems described herein.

For best results, the voltage measurements should be made when the battery is fully relaxed. However, for a plug-in hybrid (PHEV) or battery electric vehicle (BEV) the fully relaxed condition may occur less frequently. With plug-in vehicles, an operator is likely to park the vehicle and immediately plug in a charger to initiate charging. Further, the operator may unplug the charger and begin driving immediately. Under these conditions, the traction battery may not achieve a fully relaxed condition for optimal voltage measurement. Using the voltages at the start of an ignition cycle may cause estimates of battery capacity to be inaccurate. Over time, the estimated battery capacity may deviate from the true value in a vehicle that follows this pattern. A method of determining the accuracy of the present battery capacity estimate could be used to improve the battery capacity estimate.

By rearranging equation (1), a final SOC value can be computed as follows:

$$SOC_{final} = SOC_{init} - \frac{\int_{Ti}^{Tf} i dt}{C_{bat}} \quad (2)$$

It may be observed that if the presently estimated battery capacity ($C_{bat}$) is not accurate, the Amp-hour integration based SOC value will not be accurate. Any inaccuracy may affect electric-range determination, charge-time estimation, and power limit determination. As such, improving the estimate of battery capacity leads to improvements in those estimates that depend on the battery capacity estimate.

The learned battery capacity may diverge from the true capacity value due to factors such as sensor measurement noise and vehicle operating conditions. When the battery capacity value is periodically learned, a method of determining the quality of the estimated capacity value is desirable. A battery capacity estimate that is evaluated to be of high quality may then be used for computing related dependent parameters. A battery capacity estimate that is evaluated to be of low quality may trigger computation of an updated battery capacity.

The SOC may be estimated during a drive cycle based on the initial SOC based on the terminal voltage, the current throughput during the drive cycle, and the estimated battery capacity as described in equation (2). The initial SOC ($SOC_{init}$) may be evaluated at the initiation of the ignition cycle as described. During the drive cycle, the battery current may be measured and integrated to obtain the current throughput. The present estimate of the battery capacity may be used to determine the change in SOC over the drive cycle. The drive cycle may include the period of time from the initiation of an ignition cycle to termination of the ignition cycle. At the termination of the ignition cycle, the SOC value (SOC) may be stored in non-volatile memory for use in a subsequent ignition cycle.

At the initiation of the next ignition cycle, the initial SOC may be derived as described. The ending SOC from the previous ignition cycle may be retrieved from non-volatile memory. A comparison may be made between the initial SOC and the ending SOC from the immediately previous ignition cycle. If the initial SOC of the present ignition cycle is greater than the ending SOC of the previous ignition cycle, this may indicate that the battery capacity estimate is less than the true value. If the initial SOC of the present ignition cycle is less than the ending SOC of the previous ignition cycle, this may indicate that the battery capacity estimate is greater than the true value.

The accuracy of the battery capacity value may also be determined based on energy flowing into the battery and the energy stored in the traction battery after a charge cycle.

Energy stored in the traction battery after charging may be estimated as:

$$E_{chgBat} = C_{bat} \int_{SOC_1}^{SOC_2} OCV \times d(SOC) \quad (3)$$

where $C_{bat}$ is the present battery capacity estimate, and the integral term is derived from the area under the OCV v. SOC curve (see FIG. 3) over an SOC range from $SOC_1$ to $SOC_2$ during the charge cycle. The estimated amount of energy stored in the traction battery during a charge cycle may be represented as a product of a capacity estimate and an area under the curve representing open-circuit voltage as a function of state of charge over a state of charge interval corresponding to a charge cycle. The total charge energy flowing into the battery from the external power source may be estimated as the integration of battery charge power (e.g., the product of battery terminal voltage and battery charge current) as follows:

$$E_{chg} = \int V_t |i| dt \quad (4)$$

The energy stored in the traction battery and the energy supplied to the traction battery are related as follows:

$$E_{chg} = E_{chgBat} + H \quad (5)$$

where H is the heat dissipation during charging. Due to the heat dissipation during charging, it is expected that the energy supplied to the traction battery ($E_{chg}$) is greater than energy stored in the traction battery ($E_{chgBat}$). It is then expected that the following condition should be met:

$$E_{chg} > E_{chgBat} \quad (6)$$

When the estimate of battery capacity ($C_{bat}$) is correct, the following equation should be satisfied:

$$\frac{E_{chg}}{\int_{SOC_1}^{SOC_2} OCV \times d(SOC)} > C_{bat} \quad (7)$$

If the relationship is not satisfied, then the estimate of battery capacity may be deemed to be inaccurate. When the relationship is not satisfied it indicates that with the present battery capacity estimate the traction battery stored more energy than was supplied. Such a result is highly unlikely. Therefore, when the relationship is not satisfied, it is possible that the battery capacity estimate is in error. In response, a battery capacity update may be scheduled or initiated. In addition, until the battery capacity is estimated, operation of control strategies that utilize the battery capacity estimate may be altered.

Control strategy modifications may include those strategies that utilize the battery capacity estimate. For example, the SOC may be computed as a weighted average of separately derived SOC estimates. A first SOC estimate may be based on the open-circuit voltage at power up as described. In some configurations, the first SOC estimate may be based on an estimate of the open-circuit voltage. The estimate of the open-circuit voltage may be derived from the battery terminal voltage. For example, the open-circuit voltage ($V_{oc}$) may be estimated as a sum of the battery terminal voltage ($V_t$) and the voltage drop across the battery equivalent internal resistance expressed as the product of the battery current and a resistance value (i*R). A second SOC estimate may be based on the Amp-hour integration. Such an SOC computation may be described as:

$$SOC_{Final} = W_{volt-based} SOC_{volt-based} + W_{amp-based} SOC_{amp-based} \quad (8)$$

where $SOC_{volt-based}$ is an SOC estimate derived from the open-circuit voltage measured at power up or estimated from the battery terminal voltage under load conditions, $SOC_{amp-based}$ is an SOC estimate derived from Amp-hour integration, and $W_{volt-based}/W_{amp-based}$ are weighting factors. The weighting factors may be fractional amounts such that the sum of the weighting factors is one. As discussed, the Amp-hour integration based SOC estimate relies on the battery capacity value. When it is determined that the battery capacity estimate is no longer accurate, the weighting factors may be adjusted to place less weight on the Amp-hour integration based SOC value.

The BECM 206 may implement a control strategy for adjusting SOC window limits. The BECM 206 may operate the traction battery 124 within a range of SOC values between a maximum SOC limit and a minimum SOC limit. The SOC range may be configured to balance battery life with an operating range that is as large as possible. As the battery capacity changes the window limits may be adjusted accordingly. For example, if the battery capacity has decreased, the window limits may no longer satisfy the expected operational requirements.

Figure 4:
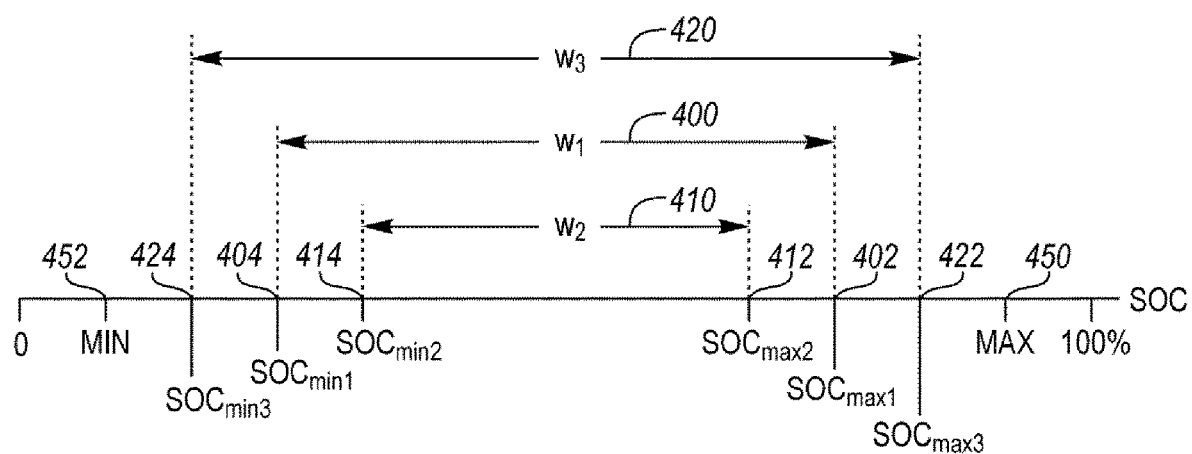
FIG. 4 is a plot depicting state of charge operating windows.

FIG. 4 depicts various SOC operating windows that may be used during operation of the traction battery over time. For example, the traction battery may be initially operated within SOC limits defined by a first window 400 (W1) that is defined by a first maximum SOC 402 (SOCmax1) and a first minimum SOC 404 (SOCmin1). During operation the battery capacity may be expected to decrease. The battery capacity estimate may become larger than the actual value over time. In this case, the estimated change in SOC computed from equation (2) may be lower than the actual change in SOC. The result is that the estimated SOC changes are actually less than the actual SOC changes. In this situation, an SOC estimated as the first maximum SOC 402 may actually be greater than the first maximum SOC 402. Similarly, an SOC estimated as the first minimum SOC 404 may actually be less than the first minimum SOC 404. The decrease in the actual battery capacity relative to the estimated battery capacity may cause operation outside of the first SOC window 400.

To compensate for this, the SOC operating window may be changed to a second SOC window 410 (W2) defined by a second maximum SOC 412 (SOCmax2) and a second minimum SOC 414 (SOCmin2). The second maximum SOC 412 may be less than the first maximum SOC 402 and the second minimum SOC 414 may be greater than the first minimum SOC 404 such that the traction battery is operated at a reduced range of SOC values when compared to the first SOC window 400. The change to the second SOC window 410 may be in response to determining that the battery capacity is no longer accurate. The effect is that the operating SOC window may be narrowed until the battery capacity is estimated again.

After the battery capacity is estimated and determined to be accurate again, the SOC operating window may be widened. In some configurations, the traction battery may return to operation within the first SOC window 400. In some configurations, the SOC operating window may be changed to a third SOC window 420 (W3) defined by a third SOC maximum 422 (SOCmax3) and a third SOC minimum 424 (SOCmin3). The third SOC maximum 422 may be greater than the first SOC maximum 402 and the third SOC minimum 424 may be less than the first SOC minimum 404 to define a broader operating range. The third SOC maximum 422 and the third SOC minimum 424 may be defined to maintain the same amount of energy consumption from the traction battery as the initial SOC window. Note that the maximum window value may be limited to a maximum value 450 (MAX) and the minimum window value may be limited to a minimum value 452 (MIN) to protect the traction battery from operating outside of recommended operating ranges.

Figure 5:
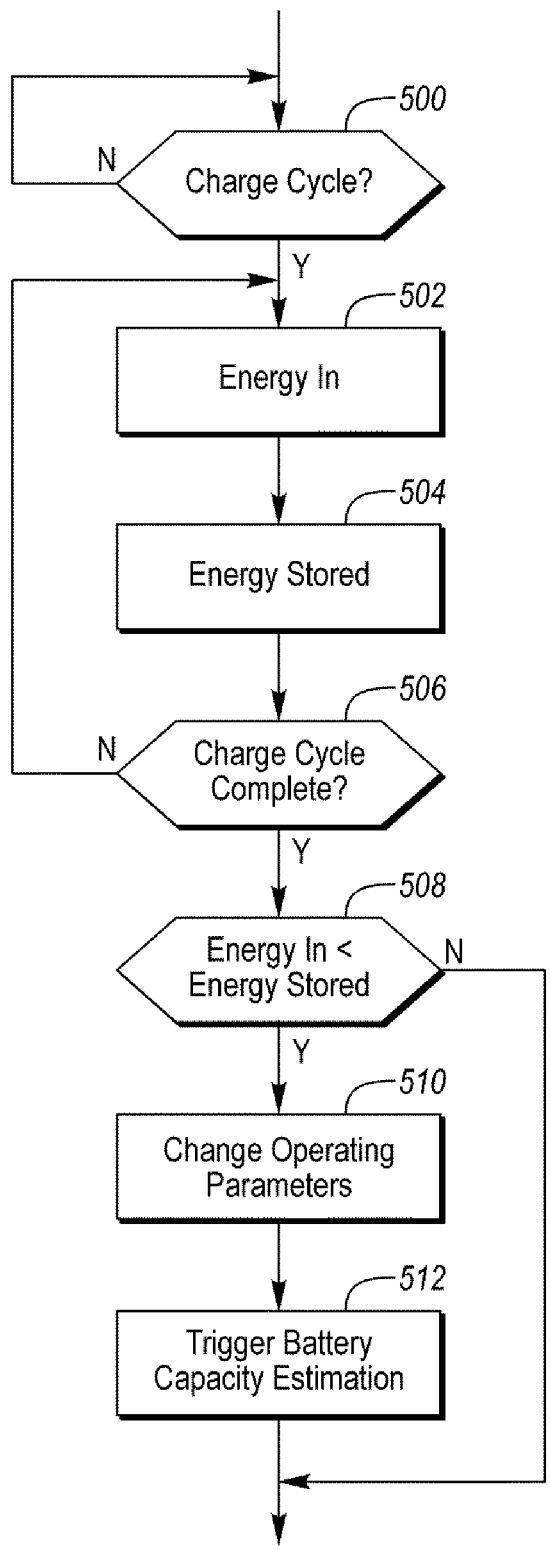
FIG. 5 is a flowchart depicting a possible sequence of operations that may be performed by a battery controller.

FIG. 5 depicts a flow chart describing a possible sequence of operations that may be implemented in a controller (e.g., BECM 206). At operation 500, a check is made to determine if a charge cycle has been initiated. For example, a charge cycle may be initiated when a charger is plugged in the charge port and power is directed to the traction battery 124. If no charge cycle is initiated operation 500 may be repeated at predetermined intervals. If a charge cycle is detected, then operation 502 may be performed. At operation 502, the energy into the battery may be computed as described herein. At operation 504, the energy stored in the traction battery may be computed as described herein. At operation 506, a check may be performed to determine if the charge cycle is complete. For example, the charger may be disconnected from the vehicle or the traction battery may be fully charged. If the charge cycle is not complete operations 502 and 504 may be repeated during the charge cycle. If the charge cycle is completed, operation 508 may be performed.

At operation 508, a comparison is made between the energy input to the traction battery during charging and the amount of energy stored during the charge cycle. If the energy input is greater than or equal to the energy stored, execution may be complete without additional operations. If the energy input is less than the energy stored, then operation 510 may be performed. At operation 510 the operating parameters of the traction battery may be changed. For example, the SOC window limits may be modified and/or the SOC computation may be modified to change weighting values. At operation 512, a battery capacity estimation function may be triggered.

The system and methods described herein may improve traction battery operation by provided an indication of the quality of the estimated battery capacity. In response to detecting that the amount of energy supplied to the traction battery during a charge cycle is less than an estimated amount of energy stored in the traction battery during the charge cycle, the system detects that the capacity of the traction battery has changed. That is, the previously estimated capacity value is no longer applicable to the current state of the traction battery. The controller may then alter an operating strategy of the traction battery until the capacity estimate is updated. By estimating the quality of the battery capacity estimate operation of the traction battery is improved. Further, by modifying operating parameters of the traction battery when the battery capacity estimate is inaccurate traction battery life and performance is improved.

The processes, methods, or algorithms disclosed herein can be deliverable to/implemented by a processing device, controller, or computer, which can include any existing programmable electronic control unit or dedicated electronic control unit. Similarly, the processes, methods, or algorithms can be stored as data and instructions executable by a controller or computer in many forms including, but not limited to, information permanently stored on non-writable storage media such as ROM devices and information alterably stored on writeable storage media such as floppy disks, magnetic tapes, CDs, RAM devices, and other magnetic and optical media. The processes, methods, or algorithms can also be implemented in a software executable object. Alternatively, the processes, methods, or algorithms can be embodied in whole or in part using suitable hardware components, such as Application Specific Integrated Circuits (ASICs), Field-Programmable Gate Arrays (FPGAs), state machines, controllers or other hardware components or devices, or a combination of hardware, software and firmware components.

While exemplary embodiments are described above, it is not intended that these embodiments describe all possible forms encompassed by the claims. The words used in the specification are words of description rather than limitation, and it is understood that various changes can be made without departing from the spirit and scope of the disclosure. As previously described, the features of various embodiments can be combined to form further embodiments of the invention that may not be explicitly described or illustrated. While various embodiments could have been described as providing advantages or being preferred over other embodiments or prior art implementations with respect to one or more desired characteristics, those of ordinary skill in the art recognize that one or more features or characteristics can be compromised to achieve desired overall system attributes, which depend on the specific application and implementation. These attributes may include, but are not limited to cost, strength, durability, life cycle cost, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and can be desirable for particular applications.

What is claimed is:
1. A vehicle power system comprising:
a controller programmed to operate a traction battery within a first state of charge range and, in response to an amount of energy supplied to the traction battery during a charge cycle being less than an estimated amount of energy stored in the traction battery during the charge cycle, operate the traction battery within a second state of charge range that is narrower than the first state of charge range.

2. The system of claim 1 wherein the controller is further programmed to estimate an amount of energy stored in the traction battery during the charge cycle as a product of a capacity estimate and an area under a curve representing open-circuit voltage as a function of state of charge over a state of charge interval corresponding to the charge cycle.

3. The system of claim 1 wherein the controller is further programmed to estimate the amount of energy supplied to the traction battery as an integration of a product of a traction battery terminal voltage and a battery current during the charge cycle.

4. The system of claim 1 wherein the controller is further programmed to, in response to the amount of energy supplied being less than the estimated amount of energy stored, trigger an estimation cycle to update a capacity estimate of the traction battery.

5. The system of claim 4 wherein the controller is further programmed to, in response to completion of the estimation cycle, operate the traction battery within a third state of charge range that is based on the capacity estimate.

6. The system of claim 1 wherein the controller is further programmed to estimate a state of charge of the traction battery according to a weighted function of a voltage-based state of charge estimate and a current-based state of charge estimate and, in response to the amount of energy supplied being less than the estimated amount of energy stored, increase a first weighting factor associated with the voltage-based state of charge estimate and decrease a second weighting factor associated with the current-based state of charge estimate.

7. The system of claim 1 wherein a maximum state of charge associated with the second state of charge range is less than a maximum state of charge associated with the first state of charge range.

8. A method comprising:
operating by a controller a traction battery of a vehicle such that a state of charge is within a state of charge operating range; and
narrowing by the controller the state of charge operating range in response to an amount of energy supplied to the traction battery during a charge cycle being less than an estimated amount of energy stored in the traction battery during the charge cycle.

9. The method of claim 8 further comprising estimating by the controller a capacity of the traction battery in response to the amount of energy supplied being less than the estimated amount of energy stored.

10. The method of claim 8 further comprising estimating by the controller the amount of energy supplied as an integration of a product of a traction battery terminal voltage and a battery current during the charge cycle.

11. The method of claim 8 further comprising estimating by the controller the amount of energy stored in the traction battery during the charge cycle as a product of a capacity estimate and an area under a curve representing open-circuit voltage as a function of state of charge over a state of charge interval corresponding to the charge cycle.

12. The method of claim 8 further comprising estimating by the controller the state of charge of the traction battery according to a weighted function of a voltage-based state of charge estimate and a current-based state of charge estimate.

13. The method of claim 12 further comprising, in response to the amount of energy supplied being less than the estimated amount of energy stored, increasing a first weighting factor associated with the voltage-based state of charge estimate and decreasing a second weighting factor associated with the current-based state of charge estimate.

14. A vehicle comprising:
a traction battery; and
a controller programmed to operate the traction battery within a state of charge operating range defined by an upper limit and a lower limit and, in response to an amount of energy supplied to the traction battery during a charge cycle being less than an estimated amount of energy stored in the traction battery during the charge cycle, reduce the upper limit.

15. The vehicle of claim 14 wherein the controller is further programmed to estimate the amount of energy stored in the traction battery during the charge cycle as a product of a capacity estimate of the traction battery and an area under a curve representing open-circuit voltage as a function of state of charge over a state of charge interval corresponding to the charge cycle.

16. The vehicle of claim 14 wherein the controller is further programmed to estimate the amount of energy supplied to the traction battery as an integration of a product of a traction battery terminal voltage and a battery current during the charge cycle.

17. The vehicle of claim 14 wherein the controller is further programmed to, in response to the amount of energy supplied being less than the estimated amount of energy stored, increase the lower limit.

18. The vehicle of claim 14 wherein the controller is further programmed to, in response to the amount of energy supplied being less than the estimated amount of energy stored, initiate an estimation cycle for a battery capacity estimate.

19. The vehicle of claim 18 wherein the controller is further programmed to, in response to completion of the estimation cycle, change the upper limit based on the battery capacity estimate.

20. The vehicle of claim 14 wherein the controller is further programmed to estimate a state of charge of the traction battery according to a weighted function of a voltage-based state of charge estimate and a current-based state of charge estimate and, in response to the amount of energy supplied being less than the estimated amount of energy stored, increase a first weighting factor associated with the voltage-based state of charge estimate and decrease a second weighting factor associated with the current-based state of charge estimate.

* * * * *